United States Patent
Chen

(10) Patent No.: US 7,366,260 B2
(45) Date of Patent: Apr. 29, 2008

(54) EFFICIENT MLSE EQUALIZER IMPLEMENTATION

(75) Inventor: Sheng-Jie Chen, Longtan Shiang (TW)

(73) Assignee: Benq Corporation, Taoyuan (TW)

( * ) Notice: Subject to any disclaimer, the term of this patent is extended or adjusted under 35 U.S.C. 154(b) by 743 days.

(21) Appl. No.: 10/851,529

(22) Filed: May 21, 2004

(65) Prior Publication Data

US 2005/0259766 A1 Nov. 24, 2005

(51) Int. Cl.
*H04L 27/06* (2006.01)
(52) U.S. Cl. .................................................. 375/341
(58) Field of Classification Search ............... 375/229, 375/230, 231, 232, 233, 234, 235, 236, 340, 375/341; 333/18, 28 R; 708/300, 322, 323; 379/340, 398; 714/794, 795, 796; 704/242
See application file for complete search history.

(56) References Cited

U.S. PATENT DOCUMENTS

| | | | | |
|---|---|---|---|---|
| 5,432,821 A * | 7/1995 | Polydoros et al. | .......... | 375/340 |
| 6,111,923 A * | 8/2000 | Mueller et al. | .......... | 375/341 |
| 6,424,940 B1 * | 7/2002 | Agassy et al. | .......... | 704/219 |
| 2005/0018794 A1 * | 1/2005 | Tang et al. | .......... | 375/341 |

* cited by examiner

*Primary Examiner*—Sam K. Ahn
(74) *Attorney, Agent, or Firm*—Thomas, Kayden, Horstemeyer & Risley

(57) ABSTRACT

A path metric computation method and apparatus for estimating a maximum likelihood sequence in a wireless communication network. The proposed method applies the statistical properties of estimated channel impulse response to reduce the computational load. A threshold is set to check the significance of each autocorrelation value in order to determine the contribution to the path metric increment. The corresponding terms in the path metric equation with insignificant autocorrelation values are thus discarded to reduce the complexity of path metric computation.

10 Claims, 7 Drawing Sheets

| Equalizer type | Performance | Complexity (L=Length of ISI) |
|---|---|---|
| ML equalizer | Optimum | $2^{L+1}$ |
| Decision feedback equalizer | Sub-optimum (better than linear equalizer) | $2L$ |
| Linear equalizer | Sub-optimum | $L$ |

FIG. 1 (RELATED ART)

EFFICIENT MLSE EQUALIZER IMPLEMENTATION

BACKGROUND OF THE INVENTION

1. Field of the Invention

The present invention relates to an equalizer used in a communication network, and more specifically, to a method and apparatus for simplifying the metric calculation of Maximum Likelihood Sequence Estimation (MLSE).

2. Description of the Related Art

The modulation algorithm employed in both Global System for Mobile (GSM) and General Packet Radio System (GPRS) communication networks is Gaussian Minimum Shift Keying (GMSK), which induces inter-symbol interference (ISI) in the received signal sampled at a specific rate. ISI is the residual effect of other neighboring symbols when decoding a certain symbol and this residual effect is due to the occurrence of pulses before and after the sampling instance. The unavoidable presence of ISI in the system, however, introduces errors in the decision device at the receiver output. Therefore, in the filter design of the GSM/GPRS receiver and transmitter, the object is to diminish the effects of ISI and thereby deliver the digital data to the destination with the smallest error rate possible. An equalizer is a widely used approach for compensating or reducing the ISI effect.

In general, there are three types of equalizers: maximum likelihood (ML) equalizer, liner equalizer, and decision feedback equalizer. The ML equalizer is based on the maximum likelihood sequence detection criterion, whereas the linear equalizer is based on the use of a linear filter with adjustable coefficients. The decision feedback equalizer is based on the use of previous detected symbols to suppress the ISI in the present symbol being detected. The performance and complexity of these equalizers are listed in the table shown in FIG. 1. The ML equalizer has optimum performance among the three equalizers. The complexity of the ML equalizer, however, is the highest. In FIG. 1, L indicates the length of ISI.

An exemplary transmission model of a wireless communication system is shown in FIG. 2. A signal 21 from the transmitter 22 is first filtered by a Low Pass (LP) filter 221, converted to radio frequency (RF) by multiplying a carrier in a multiplier 222, and finally passed to a processing unit 223 before transmission to the channel 24. The processing unit 223 extracts the real part of the signal. The characteristic of the channel 24 is modeled by a channel response block 241 with channel noise 23. The channel noise 23 is generally assumed as Additive White Gaussian Noise (AWGN). The multiplier 261 in the receiver 26 converts back the frequency of the signal received by the receiver by multiplying the same frequency as the carrier frequency. The LP filter 262 receives the down converted signal, and outputs a received signal 25. The equalizer 263 compensates the ISI of the received signal 25, and outputs an estimated signal 27. The received signal r(t) 25 is expressed by Equation [1].

$$r(t) = \sum_n a_n h(t-nT) + n(t) \qquad \text{Equation [1]}$$

h(t) denotes the overall channel response of the system, and it can be derived by performing convolution to the transmitter's impulse response $f_t(f)$, receiver's impulse response $f_r(t)$, and channel model response g(t), $h(t)=f_t(t)*g(t)*f_r(t)$.

The channel noise n(t) 23 herein is assumed to be stationary Gaussian noise with zero mean and variance $N_o$. Let $\{a_n\}$ (which is also the signal 21 in FIG. 2) be a hypothetical sequence of pulse amplitudes transmitted during a time period I. The equalizer 263 is assumed to be a ML equalizer, which determines the best estimation of $\{a_n\}$ as the estimated sequence $\{â_n\}$ (signal 27 of FIG. 2). The estimated sequence $\{\alpha_n\}=\{â_n\}$ is derived by maximizing the likelihood function as shown in Equation [2].

$$p[r(t), t \in I \,|\, \{\alpha_n\}] \qquad \text{Equation [2]}$$

The probability of 0s and 1s in the transmitted sequences are assumed to be equal, therefore, Equation [2] can be rewritten as:

$$p[\{\alpha_n\} \,|\, r(t)] = \frac{p(r(t) \,|\, \{\alpha_n\}) p(\{\alpha_n\})}{p(r(t))} \qquad \text{Equation [3]}$$

$p[\{\alpha_n\}|r(t)]$ is also called the posteriori probability. The probability of the estimated sequence $p[\{\alpha_n\}]$ and the received signal r(t) are both assumed to be constant. Since the objective of the ML equalizer is to maximize the likelihood function shown in Equation [2], the posteriori probability must also be maximized. If the sequence $\{\alpha_n\}$ was the actual sequence of the pulse amplitude transmitted during time period I, the power density function of the noise signal n(t) can be expressed as shown in Equation [4].

$$n(t \,|\, \{\alpha_n\}) = r(t) - \sum_{nT \in I} \alpha_n h(t-nT), \, t \in I \qquad \text{Equation [4]}$$

The ML function of Equation [2] thus becomes:

$$p(r(t) \,|\, \{\alpha_n\}) = p[n(t) \,|\, \{\alpha_n\}] \qquad \text{Equation [5]}$$

$$= \left(\frac{1}{2\pi N_o}\right)^N \exp\left(-\frac{1}{2N_o}\sum_{k=1}^{N} \left|r_k - \sum_n \alpha_n h_{kn}\right|^2\right)$$

The probability of the ML function $p[r(t)|\{\alpha_n\}]$ is proportional to the logarithm. $p[r(t)|\{\alpha_n\}]$:

$$-\int_{-\infty}^{\infty} \left|r(t) - \sum_n \alpha_n h(t-nT)\right|^2 dt = \qquad \text{Equation [6]}$$

$$-\int_{-\infty}^{\infty} |r(t)|^2 dt + 2\text{Re}\sum_n \left[\alpha_n^* \int_{-\infty}^{\infty} r(t) h^*(t-nT) dt\right] -$$

$$\sum_n \sum_m \alpha_n^* \alpha_m \int_{-\infty}^{\infty} h^*(t-nT) h(t-mT) dt$$

The first term of Equation [6] is a constant, thus it can be discarded when calculating the metric. A correlation metric (MC) can be derived from the previous steps as shown in Equation [7].

$$CM(\{\alpha_l\}) = 2\text{Re}\sum_{nT \in I}(\alpha_n^* Z_n) - \sum_{iT \in I}\sum_{kT \in I}\alpha_n^* \alpha_k s_{i-k} \quad \text{Equation [7]}$$

where $$Z_n = g_{MF}(t) * r(t)|_{t=nT} = \sum_l a_{n-l} s_l + w_n$$

$$s_l = g_{MF}(t) * h(t)|_{t=lT} = s_{-l}^* \text{ and}$$

$$g_{MF}(t) = h^*(-t)$$

$s_1$ herein is the channel response autocorrelation.

Maximum Likelihood Sequence Estimation (MLSE) determines the most likely sequence originally transmitted by the sequence $\{\alpha_n\}$ by maximizing the likelihood function shown in Equation [5], or equivalently, maximizing the metric shown in Equation [8].

$$J_n(\{\alpha_l\}) = 2\text{Re}\sum_{nT \in I}(\alpha_n^* Z_n) - \sum_{iT \in I}\sum_{kT \in I}\alpha_i^* s_{i-k}\alpha_k \quad \text{Equation [8]}$$

The MLSE algorithm obtained represents a modified version of the well-known Viterbi algorithm. The Viterbi algorithm is obtained by computing the recursive relation iteratively.

$$J_n(\ldots, \alpha_{n-1}, \alpha_n) = \quad \text{Equation [9]}$$

$$J_{n-1}(\ldots, \alpha_{n-1}) + \text{Re}\left[\alpha_n^*\left(2Z_n - s_0\alpha_n - 2\sum_{k \leq n-1} s_{n-k}\alpha_k\right)\right].$$

FIG. 3 shows the architecture of the Viterbi Equalizer, wherein the received signal r(t) is estimated according to Equation [1].

SUMMARY OF THE INVENTION

Accordingly, the object of the present invention is to reduce the complexity of metric calculation for Maximum Likelihood Sequence Estimation (MLSE) in Global System for Mobile (GSM) or General Packet Radio Service (GPRS) communication network. The path computation of equalizer causes most of the computation load, so the processing speed can be accelerated by simplifying the path computation. As a result, the power consumption of the Mobile Station (MS) can also be greatly reduced.

The present invention provides a path metric computation method for estimating a maximum likelihood sequence, wherein a survival path of each sample is determined according to the channel impulse response of N samples in the path metric computation. The autocorrelation values S(n) of the channel impulse response corresponding to the N samples (n ranges from 0 to N-1) is first calculated, subsequently, each autocorrelation value S(n) is normalized by dividing S(0) to obtain the normalized values NS (n). The normalized values NS (n) are compared to a preset threshold individually. Each S(n) is judged as a significant autocorrelation value if the corresponding NS(n) is greater than the threshold, otherwise, the S(n) is judged as an insignificant autocorrelation value. The insignificant autocorrelation values are discard as the autocorrelation values are too small to have an effect on the major path metric for determining the survival path. The survival path is therefore determined by considering only the significant autocorrelation values.

The path metric computation proposed in the present invention is implemented in an equalizer, and the Maximum Likelihood Sequence Estimation (MLSE) Viterbi equalizer is a commonly used equalizer in the GSM or GPRS communication network. The survival path is recorded until succeeding N samples have been passed to the equalizer, and the maximum likelihood sequence is derived by tracing back the survival path.

The present invention also provides a path metric computation apparatus comprising an autocorrelation calculator, a comparator, and a path metric computation unit. The autocorrelation calculator computes and passes the autocorrelation values S(n) to the comparator. The comparator only outputs autocorrelation values S(n) which are greater than a preset threshold to the path metric computation unit. The path metric computation unit computes the path metric and determines the survival path with the maximum path metric.

BRIEF DESCRIPTION OF THE DRAWINGS

The present invention can be more fully understood by reading the subsequent detailed description in conjunction with the examples and references made to the accompanying drawings, wherein:

FIG. 1 is a table showing the comparison of performance and complexity between the three equalizers.

DETAILED DESCRIPTION OF THE INVENTION

An embodiment of the present invention assumes that the length of the channel impulse response h(t) is equal to the duration of five symbols (L=5), which means that each sample is assumed to have an inter-symbol interference (ISI) effect on 5 neighboring samples. Since the autocorrelation $S_1$ of the channel impulse response h(t) is symmetrical, relations shown in Equation [10] must be satisfied.

$$S_l = g_{MF}(t) * h(t)|_{t-lT} = S_{-l}^*, |l| < 4 \quad S_l = 0, |l| \geq 5 \quad \text{Equation [10]}$$

The path metric equation shown in Equation [9] can be expressed as following:

$$J_n(\ldots, \alpha_{n-1}, \alpha_n) = \quad \text{Equation [11]}$$

$$J_{n-1}(\ldots, \alpha_{n-1}) + \text{Re}\left[\alpha_n^*\left(2Z_n - s_0\alpha_n - 2\sum_{l=1}^{4} S_l\alpha_{n-l}\right)\right]$$

Figure 2:
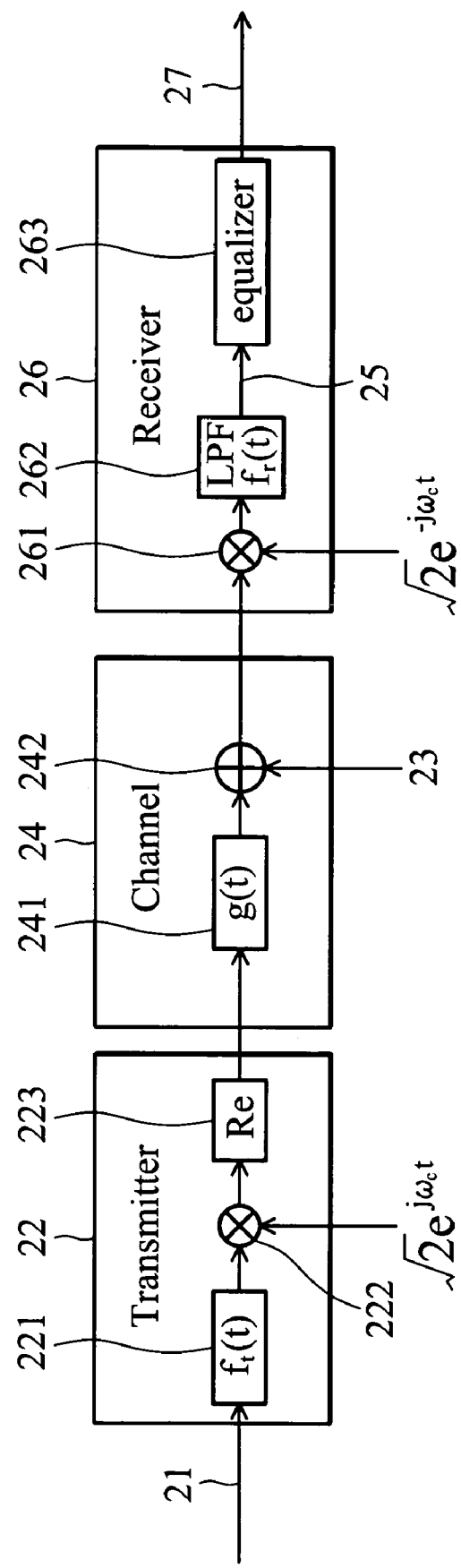
FIG. 2 is a block diagram illustrating the transmission model for a wireless communication system.
Figure 3:
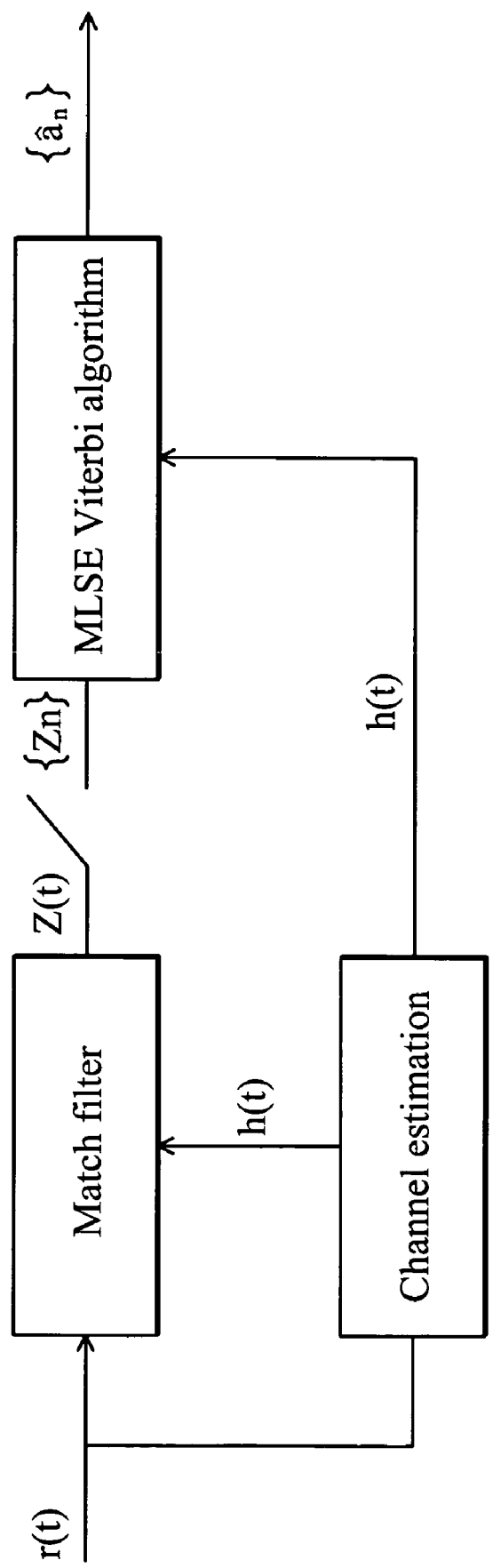
FIG. 3 is a block diagram illustrating the architecture of a Viterbi equalizer.
Figure 4:
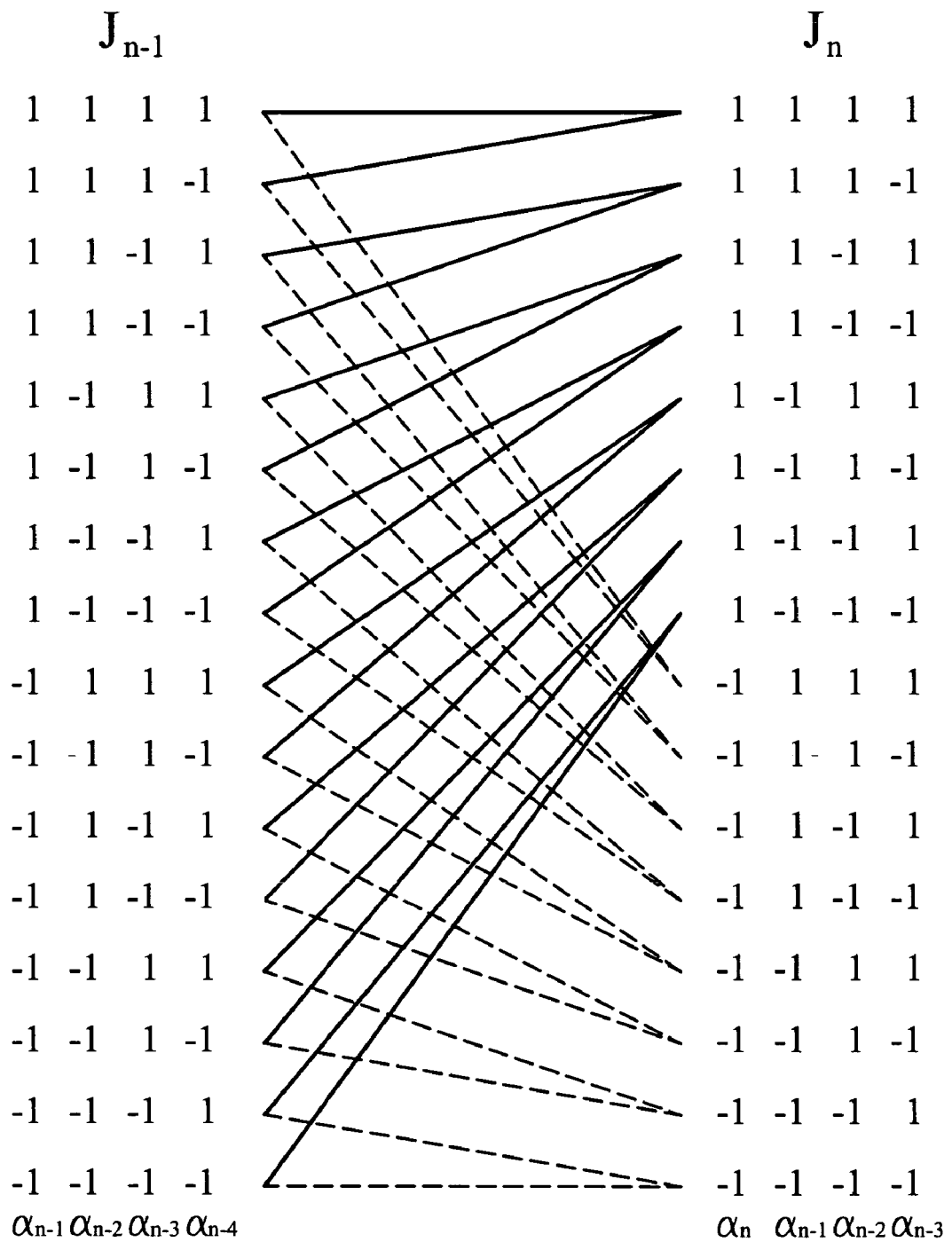
FIG. 4 is a sketch map showing the trellis diagram of the Viterbi equalizer.

A sketch map according to the path metric equation of Equation [11] is used to show the state transition and path metric calculation for L=5. FIG. 4 shows the trellis diagram of the Viterbi equalizer with L=5. As shown in FIG. 4, there are $2^{L-1}=2^{5-1}=16$ states. Each state $J_n$ contains four bits representing a current sample and three previous samples $(\alpha_n,\alpha_{n-1},\alpha_{n-2},\alpha_{n-3})$, and each state $J_n$ is merged by two of the previous states $J_{n-1}$ $(\alpha_{n-1},\alpha_{n-2},\alpha_{n-3},\alpha_{n-4})$. The two previous states are called competing paths, and the competing path with maximum path metric becomes the survival path of the current state.

Assuming there are N samples passed to the Viterbi equalizer, and each state calculates and compares the path metric with its competing path to determine the survival path for each sample. The survival path is recorded in each state until N samples have been passed to the Viterbi equalizer, and traced back to the recorded survival path history from the state with the maximum state metric. The most likely sequence that satisfies the previously described Maximum Likelihood (ML) function is determined by tracing back the survival path.

It is obvious from the previous description that path calculation causes most of the computational load in the equalizer. Therefore, by reducing the complexity of the path metric computation, the processing speed of the equalizer may be enhanced resulting in extending the battery life of the mobile station.

Figure 5:
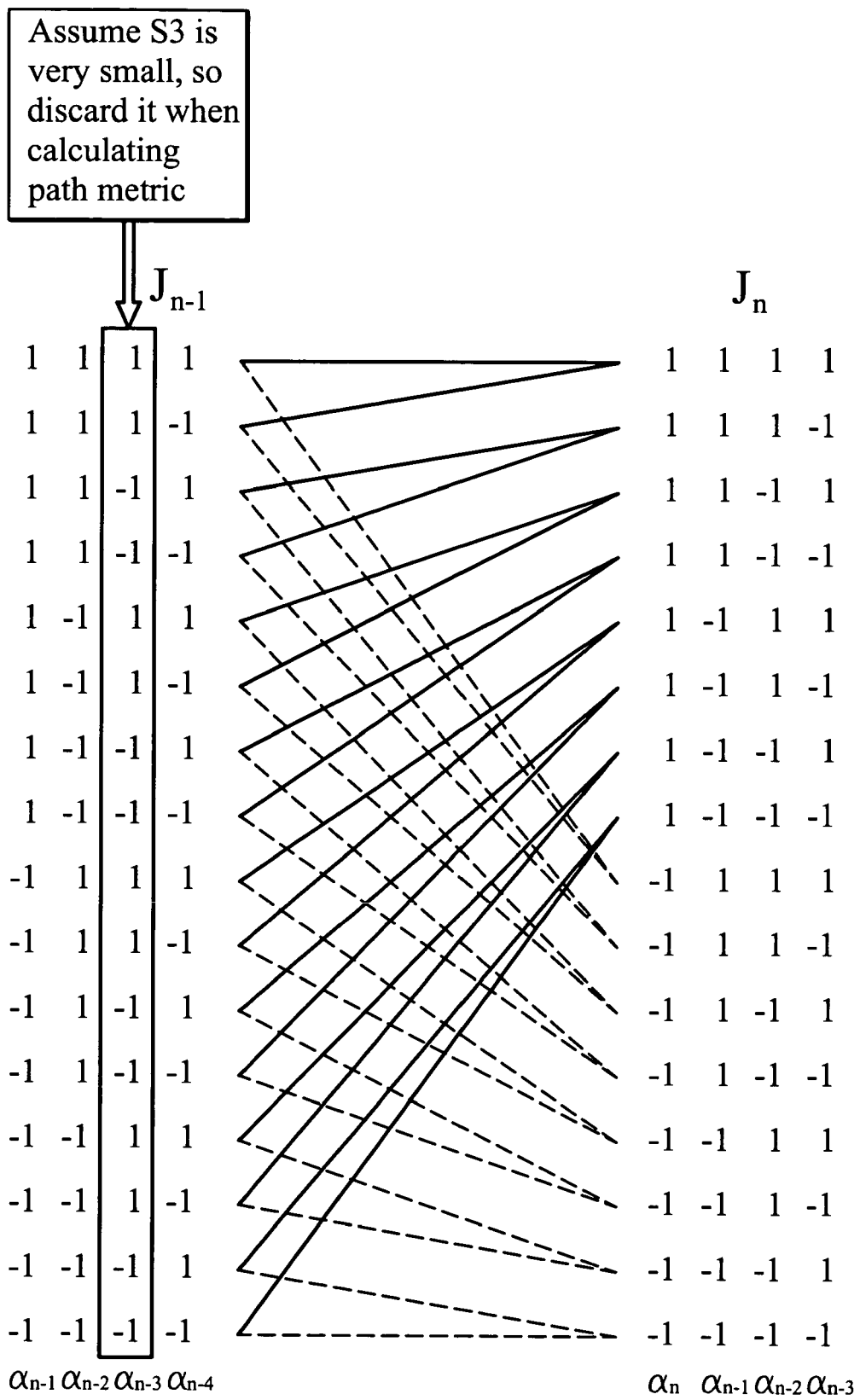
FIG. 5 is a sketch map showing the trellis diagram of the Viterbi equalizer with reduced path computation.

The path metric computation method and apparatus proposed in the present invention simplifies the computation executed by the Viterbi equalizer. The second term $$\text{Re}\left[\alpha_n^*\left(2Z_n - s_0\alpha_n - 2\sum_{l=1}^{4} S_l\alpha_{n-1}\right)\right]$$

in Equation [11] is the path metric increment, wherein $Z_n$ is the output of the received signal passed to the match filter, thus, this term can be removed from the metric calculation. The term $S_1$ represents the autocorrelation of the channel impulse response. Under various fading channel simulations, the observed value of certain $S_1$ is very small compared to other $S_1$. The corresponding contribution to the path metric increment of the insignificant $S_1$ is much less than other $S_1$. Put simply, the insignificant $S_1$ does not dominate the major path metric increment for determining the survival path, hence the term with insignificant $S_1$ can be discarded to reduce the computational load. A sketch map of the reduced path metric computation proposed in the present invention is shown in FIG. 5. $S_3$ is assumed to be insignificant when compared to the other autocorrelation values S, and therefore the term $S_3\alpha_{n-3}$ is ignored in the path metric computation. Accordingly, the total number of states is greatly reduced from 16 to 8 states.

Figure 6:
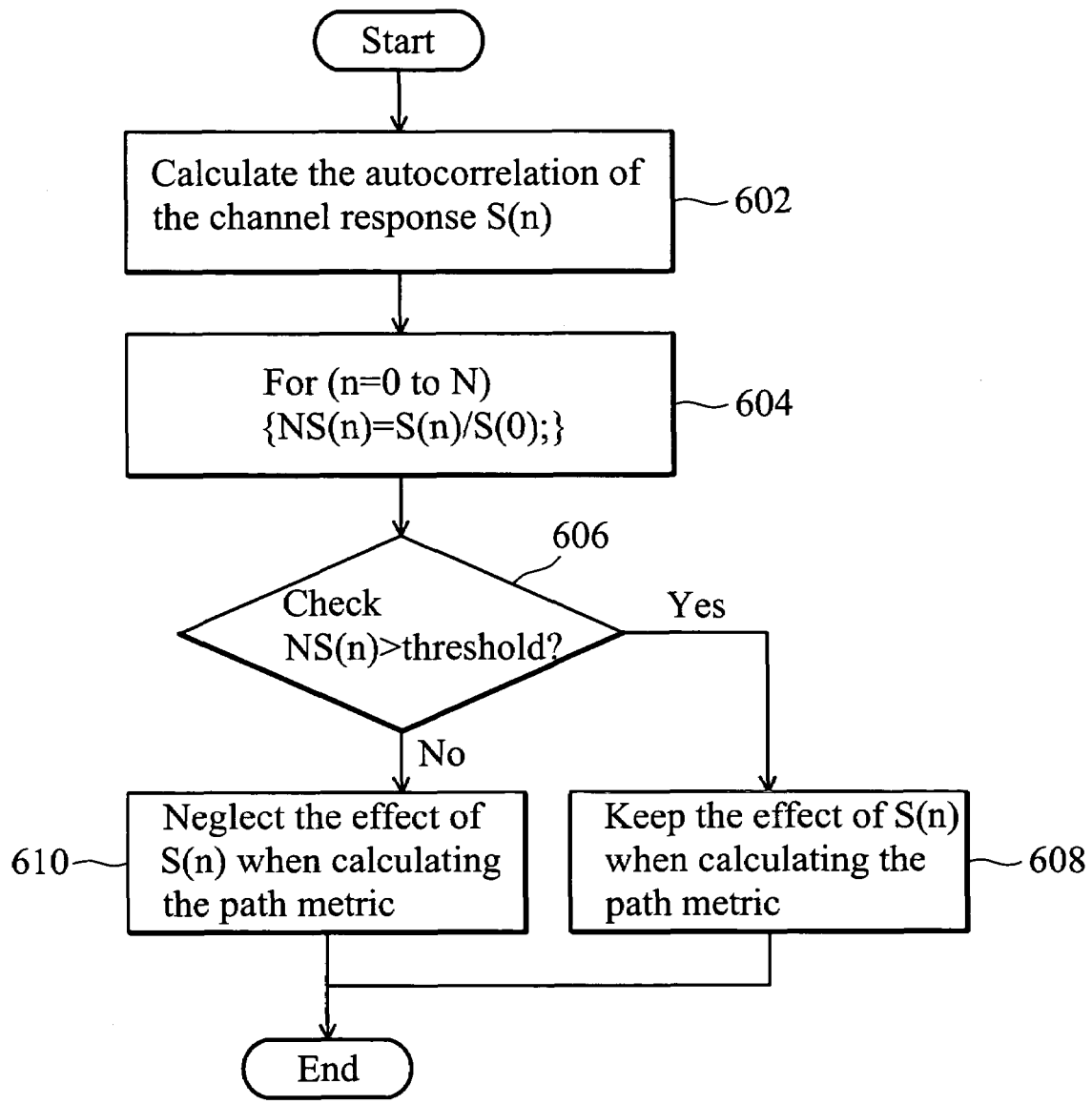
FIG. 6 is a flowchart showing the path metric computation method according to the embodiment of the present invention.

FIG. 6 is a flowchart illustrating the path metric computation method proposed in the present invention for determining significant autocorrelation values S(n) for metric computation. The autocorrelation values S(n) of the channel response are first calculated in step 602, and each S(n) is normalized by S(0) to obtain the normalized value NS(n) in step 604. Each of the normalized values NS(n) is then compared to a threshold (NS(n)>threshold?) in step 606, and if NS(n) is greater than the threshold, the corresponding S(n) will be kept for path metric computation (step 608), otherwise, the corresponding S(n) will be discarded (step 610).

Figure 7:
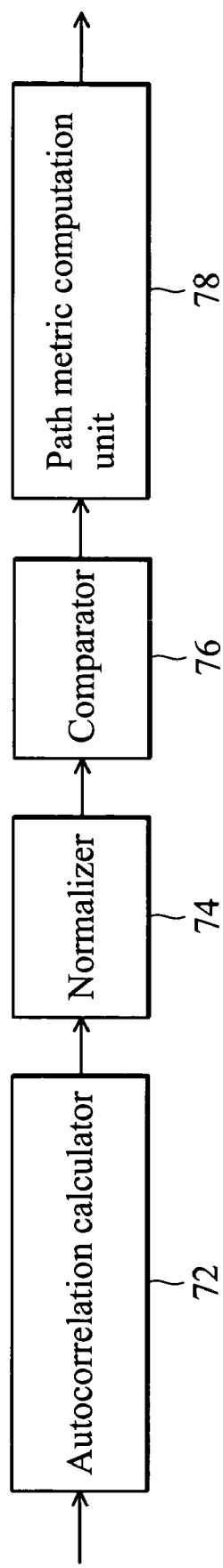
FIG. 7 is a simple block diagram showing the path metric computation apparatus according to the embodiment of the present invention.

FIG. 7 is a block diagram showing an embodiment of the path metric computation apparatus according to the present invention. The autocorrelation calculator 72 performs step 602 of FIG. 6, and passes the calculated autocorrelation values S(n) to the normalizer 74. The normalzer 74 divides each S(n) by S(0) to obtain the normalized values NS(n). The comparator 76 receives the normalized values NS(n) and determines whether each of the NS(n) is greater than a preset threshold. The comparator 76 passes the corresponding S(n) to the path metric computation unit 78 only if the NS(n) is greater than the threshold, therefore, the path metric computation unit 78 estimates the maximum likelihood sequence without considering the effect of the insignificant S(n).

Finally, while the invention has been described by way of example and in terms of the above, it is to be understood that the invention is not limited to the disclosed embodiment. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method of path metric computation for estimating a maximum likelihood sequence in a wireless communication network, wherein a survival path per sample is determined according to channel impulse response of N samples in the path metric computation wherein N is an integer, the method comprising the following steps:

calculating autocorrelation values S(n) of the channel impulse response corresponding to the N samples (n ranges from 0 to N-1);

normalizing the autocorrelation values by a first autocorrelation value S(0) to generate a plurality of normalized values:

comparing each of the plurality of normalized values to a threshold;

judging each of the autocorrelation values S(n) as a significant autocorrelation value if corresponding normalized value is greater than the threshold, else judging the autocorrelation value as insignificant;

discarding the insignificant autocorrelation value; and determining the survival path with maximum path metric by considering only the significant autocorrelation values in the path metric computation.

2. The path metric computation method according to claim 1, wherein the wireless communication network is Global System for Mobile (GSM) or General Packet Radio System (GPRS) communication network.

3. The path metric computation method according to claim 1, wherein the path metric computation is implemented in an equalizer, the survival path is recorded until succeeding N samples have been passed to the equalizer, and the maximum likelihood sequence is derived by tracing back the recorded survival path.

4. The path metric computation method according to claim 3, wherein the equalizer is a Maximum Likelihood Sequence Estimation (MLSE) Viterbi equalizer.

5. The path metric computation method according to claim 1, wherein the survival path per sample is determined according to the channel impulse response of 5 samples (N=5).

6. An apparatus of path metric computation for estimating a maximum likelihood sequence in a wireless communication network, wherein a survival path per sample is determined according to channel impulse response of N samples in the path metric computation wherein N is an integer, the apparatus comprising:

an autocorrelation calculator, for calculating autocorrelation values S(n) of the channel impulse response corresponding to the N samples (n ranges from 0 to N-1);

a normalizer, coupled to the autocorrelation calculator, normalizing the autocorrelation values S(n) by a first autocorrelation value S(0) to generate a plurality of normalized values:

a comparator, for comparing each of the normalized values to a threshold, and judging each of the autocorrelation values S(n) as a significant autocorrelation value if corresponding normalized value is greater than the threshold, else judging the autocorrelation value as an insignificant autocorrelation value; and a path metric computation unit, receiving the significant autocorrelation values from the comparator, computing the path metric by considering only the significant autocorrelation values, and determining the survival path with maximum path metric.

7. The path metric computation apparatus according to claim 6, wherein the wireless communication network is Global System for Mobile (GSM) or General Packet Radio System (GPRS) communication network.

8. The path metric computation apparatus according to claim 6, wherein the path metric computation apparatus is implemented in an equalizer, the survival path is recorded until succeeding N samples have been passed to the equalizer, and the maximum likelihood sequence is derived by tracing back the recorded survival path.

9. The path metric computation apparatus according to claim 8, wherein the equalizer is a Maximum Likelihood Sequence Estimation (MLSE) Viterbi equalizer.

10. The path metric computation apparatus according to claim 6, wherein the survival path per sample is determined according to the channel impulse response of 5 samples (N=5).

* * * * *